(12) United States Patent
Richter et al.

(10) Patent No.: US 11,783,762 B2
(45) Date of Patent: Oct. 10, 2023

(54) DEVICE AND METHOD FOR OPERATING A DIODE ARRAY

(71) Applicant: OSRAM Opto Semiconductors GmbH, Regensburg (DE)

(72) Inventors: Jens Richter, Hemau (DE); Christopher Söll, Zirndorf (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 17/761,715

(22) PCT Filed: Sep. 17, 2020

(86) PCT No.: PCT/EP2020/076004
§ 371 (c)(1),
(2) Date: Mar. 18, 2022

(87) PCT Pub. No.: WO2021/053083
PCT Pub. Date: Mar. 25, 2021

(65) Prior Publication Data
US 2022/0406247 A1 Dec. 22, 2022

(30) Foreign Application Priority Data
Sep. 20, 2019 (DE) ...................... 10 2019 125 364.0

(51) Int. Cl.
*G09G 3/32* (2016.01)

(52) U.S. Cl.
CPC ....... *G09G 3/32* (2013.01); *G09G 2310/0291* (2013.01); *G09G 2320/0233* (2013.01);
(Continued)

(58) Field of Classification Search
CPC ... G09G 3/32–3291; G09G 2300/0426; G09G 2300/043; G09G 2300/0819;
(Continued)

(56) References Cited

U.S. PATENT DOCUMENTS

2003/0122749 A1 7/2003 Booth, Jr. et al.
2005/0225683 A1 10/2005 Nozawa
(Continued)

FOREIGN PATENT DOCUMENTS

CN 106782319 A 5/2017
DE 10 2016 112 104 A1 1/2018
(Continued)

OTHER PUBLICATIONS

International Search Report issued for corresponding International Patent Application No. PCT/EP2020/076004 dated Jan. 15, 2021, along with an English translation.
(Continued)

*Primary Examiner* — Nathan Danielsen
(74) *Attorney, Agent, or Firm* — HAUPTMAN HAM, LLP

(57) ABSTRACT

An arrangement for operating a diode array includes a plurality of LEDs. Each LED is assigned a respective sensor element which is configured to detect a characteristic value representative of a luminous flux of the respective LED. The arrangement also includes a respective supply input for providing a current for light-emitting operation of the respective LED. The arrangement further includes in each case a control unit which is coupled on the input side to the respective supply input and the respective sensor element and on the output side to the respective LED and is configured to control the current for light-emitting operation of the respective LED as a function of the corresponding characteristic value. The arrangement additionally includes a
(Continued)

Figure 1:
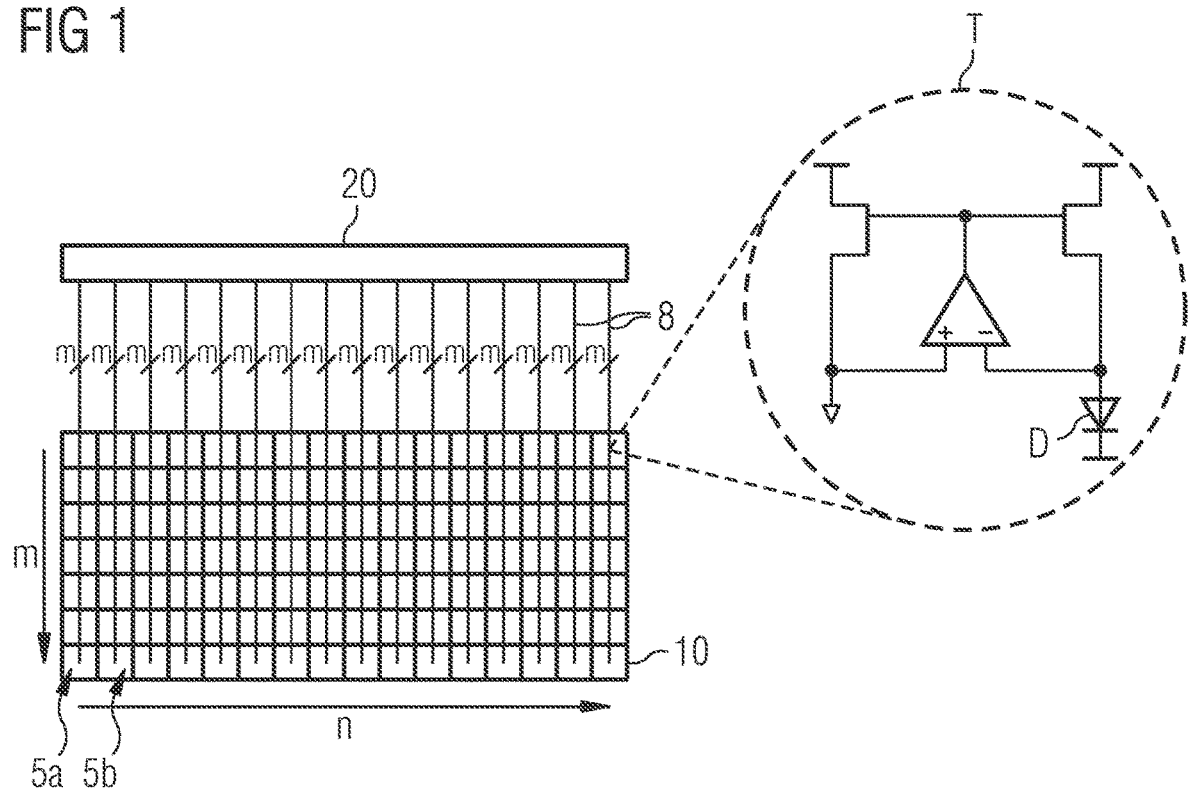
Figure 2:
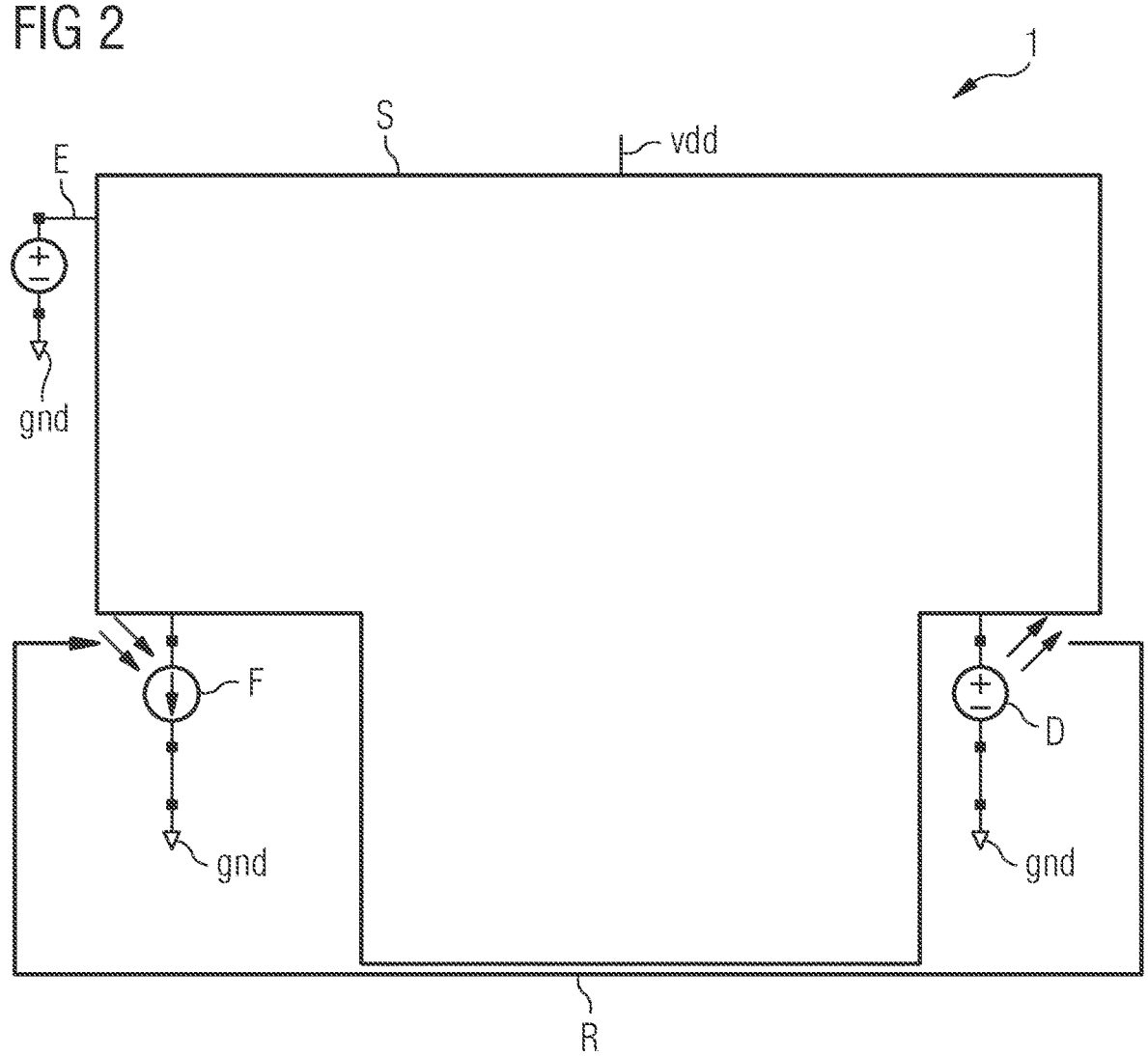

respective supply input for providing a current for light-emitting operation of the respective LED.

12 Claims, 7 Drawing Sheets

(52) U.S. Cl.
CPC ............... *G09G 2320/0626* (2013.01); *G09G 2360/147* (2013.01)

(58) Field of Classification Search
CPC ... G09G 2310/0291; G09G 2310/0264; G09G 2310/06; G09G 2310/08; G09G 2320/0223; G09G 2320/0233; G09G 2320/029; G09G 2320/0295; G09G 2320/041; G09G 2320/0626; G09G 2320/0693; G09G 2360/14; G09G 2360/145–148

See application file for complete search history.

(56) References Cited

U.S. PATENT DOCUMENTS

| | | | |
|---|---|---|---|
| 2006/0038758 A1 | 2/2006 | Routley et al. | |
| 2010/0097360 A1* | 4/2010 | Cho | G09G 3/325 345/205 |
| 2010/0252720 A1 | 10/2010 | Lan et al. | |
| 2014/0048680 A1 | 2/2014 | Wicke | |
| 2014/0253539 A1* | 9/2014 | Kline | G09G 3/3233 345/82 |
| 2018/0308418 A1* | 10/2018 | Scenini | G09G 3/32 |
| 2018/0336822 A1 | 11/2018 | Yan et al. | |
| 2020/0211463 A1* | 7/2020 | Yue | G09G 3/3258 |

FOREIGN PATENT DOCUMENTS

| | | |
|---|---|---|
| JP | 2005-530200 A | 10/2005 |
| JP | 2007-531261 A | 11/2007 |
| WO | 2007/057822 A1 | 5/2007 |

OTHER PUBLICATIONS

Written Opinion issued for corresponding International Patent Application No. PCT/EP2020/076004 dated Jan. 15, 2021.

* cited by examiner

DEVICE AND METHOD FOR OPERATING A DIODE ARRAY

CROSS REFERENCE TO RELATED APPLICATION

This application is a National Stage of International Application No. PCT/EP2020/076004, filed on Sep. 17, 2020, which designates the U.S. and was published in Europe, and which claims priority to German Patent Application No. 10 2019 125 364.0, filed on Sep. 20, 2019, in the German Patent Office. Both of the aforementioned applications are hereby incorporated by reference in their entireties.

The invention relates to an arrangement and a method for operating a diode array.

In diode arrays, the supply of individual picture elements ("pixels") poses a problem. The luminous image of a diode array depends, among other things, on how uniformly the individual light-emitting diodes (LEDs), which form the pixels, are supplied by corresponding driver current sources (so-called "matching"). For this reason, high-precision, in particular regulated current sources are usually used, which operate with the aid of a current reference. Regulated current sources have an increased output resistance, for example due to feedback, and thus provide an almost load-independent constant current.

However, a deviation of the optical output power, which is caused for example by mismatch of the current source of the pixel cells and the LED itself as well as by temperature differences between the LEDs, cannot be compensated by the listed control. Especially the latter can significantly cause an inhomogeneous luminous image in a diode array, even if the driver would have an almost perfect accuracy.

The object underlying the invention is to create an arrangement and a corresponding method that counteracts the aforementioned mismatch and contributes to a homogeneous luminous image of the diode array.

The object is solved by the independent claims. Advantageous embodiments are characterized in the dependent claims.

According to a first aspect, the invention relates to an arrangement for operating a diode array comprising a plurality of LEDs.

The diode array is, for example, a composite of laterally juxtaposed LEDs. The LEDs are arranged in particular matrix-like along columns and rows of the diode array. One pixel of the diode array can be formed by one or more LEDs. In this context, the LEDs can also be referred to as µLEDs.

In one embodiment, the LEDs of the diode array are exclusively LEDs of one color, in particular blue LEDs. In an alternative embodiment, the diode array comprises LEDs of different colors. In particular, one red, one green and one blue LED of a monolith can each form a respective pixel of the diode array by pixel-fine conversion.

In particular, the LEDs are aligned in the diode array in such a way that a respective main radiation direction of the LEDs is substantially parallel to each other and to a main radiation direction of the diode array.

In one embodiment according to the first aspect, each LED is associated with a respective sensor element that is configured to detect a characteristic value representative of a luminous flux of the respective LED.

Diodes, for example photodiodes or LEDs operated as sensors, are particularly suitable as sensor elements. The characteristic value is then a corresponding output current of the diode sensor element that depends on the incident luminous flux.

The respective sensor element is arranged in an optical path of the LED. Preferably, the respective sensor element is arranged in immediate spatial proximity with respect to the correspondingly assigned LED, exemplarily at a distance of between 10 µm and 15 mm, preferably 40 µm.

In one embodiment according to the first aspect, the arrangement comprises supply inputs for each LED for providing a current for light-emitting operation of the respective LED.

For example, the supply input is coupled to a current reference. In particular, a predetermined current can be provided via the supply input, which corresponds to a predetermined light output of the LED.

In one embodiment according to the first aspect, the arrangement comprises one control unit per LED. The respective control unit is coupled on the input side to the respective supply input and the respective sensor element and on the output side to the respective LED. The respective control unit is configured to control the current for light-emitting operation of the respective LED depending on the corresponding characteristic value.

In particular, the respective control unit is configured to adjust an operating current actually provided to the respective LED by optical feedback via the respective sensor element.

The respective control unit can also be referred to as a driver in this context. By way of example, several control units of the arrangement are arranged in a network as an integrated circuit ("IC"). In particular, all control units of the arrangement can be designed as a driver IC.

The respective control unit may be electrically and mechanically coupled to the respective LED. In particular, the diode array may be arranged on the driver IC. The driver IC can act as a carrier in this context.

In one embodiment according to the first aspect, the arrangement for operating the diode array comprises a plurality of LEDs, wherein a respective sensor element is associated with each LED. The respective sensor element is arranged to detect a characteristic value representative of a luminous flux of the respective LED. The arrangement further comprises a respective supply input for providing a current for light-emitting operation of the respective LED. Furthermore, the arrangement comprises a control unit in each case, which is coupled on the input side to the respective supply input and the respective sensor element and on the output side to the respective LED and is configured to control the current for light-emitting operation of the respective LED as a function of the corresponding characteristic value.

Optical feedback allows all LEDs of the diode array to be controlled to the same light output in an advantageous manner. In this way, a mismatch of the LEDs can be counteracted and the luminous image of the diode array can be realized much more homogeneously.

In particular, regulated current sources that control the brightness of the respective LEDs with the help of PWM engines can be dispensed with in this context. In order to compensate for mismatch of the LEDs and local temperature differences, a complex, temperature- and pixel-dependent calibration of brightness values is only optional.

In other words, the feedback of the driver is shifted from the electrical to the optical domain. The current of the driver is thus controlled depending on the actual emitted light power of the LED to be driven.

In an embodiment according to the first aspect, the respective sensor element is arranged to provide an output current depending on the corresponding characteristic value.

The respective control unit has an output transistor with a drain electrode, a control electrode and a source electrode. Furthermore, the respective control unit has a regulating unit with an input electrode and an output electrode.

The output transistor is coupled to the respective supply input via the source electrode. The output transistor is also coupled to the output electrode of the regulating unit via the control electrode. Furthermore, the output transistor is coupled to the respective LED via the drain electrode.

The regulating unit is coupled to the respective sensor element via the input electrode for receiving the output current of the respective sensor element. The regulating unit is further coupled to the control electrode of the output transistor via the output electrode. The regulating unit is arranged to compare the output current of the respective sensor element with a reference current and to switch the output transistor as a function of the comparison.

The output current corresponds to the photocurrent in the case of a diode as sensor element.

In particular, the output transistor is configured to regulate the operating current of the LED.

In one embodiment according to the first aspect, "switching" means, for example, "controlling", "driving", "regulating" or "adjusting". The regulating unit is arranged to compare the output current of the respective sensor element with a reference current and to adjust the output transistor in dependence on the comparison. Thereby, a resistance value of a controlled path of the output transistor is adjusted. The controlled path can be set by the regulating unit to be fully conductive or blocking or to resistance values between fully conductive and blocking. The regulating unit can set a level of operating current flowing through the output transistor to different values (more than two values). Alternatively, "switch" can mean "turn on or turn off".

In one embodiment according to the first aspect, the regulating unit comprises a current mirror circuit, a first resistor, a second resistor, a reference current source, and an operational amplifier. The operational amplifier includes a first control input, a second control input, and the output electrode of the regulating unit.

The current mirror circuit is coupled to the respective sensor element on the input side. The current mirror circuit is also configured to amplify the output current of the respective sensor element. In addition, the current mirror circuit is coupled on the output side to the first resistor and the first control input.

The reference current source is coupled on the output side with the second resistor as well as the second control input.

In particular, the current mirror circuit has one or more current mirrors. The output current amplified by the current mirror circuit is applied to the first resistor in particular, so that a voltage drops across the first resistor, which is fed to the operational amplifier.

In particular, the reference current provided by the reference current source is applied to the second resistor so that a voltage drops across the second resistor and is supplied to the operational amplifier.

In particular, the operational amplifier is configured to control the output transistor depending on the two supplied voltages, so that an operating current of the LED can be controlled.

In one embodiment according to the first aspect, the arrangement is arranged to sequentially light-emittingly operate the LEDs in the intended operation of the diode array. The operation is such that each LED can be alternately switched in a light-emitting first operating state and a non-light-emitting second operating state. A respective LED in the first operating state is assigned an adjacent LED in the second operating state as a sensor element.

In other words, each LED of the diode array is successively operated in a light-emitting manner ("switched on"), while no operating current is supplied to the respective other LEDs ("switched off"), with a switched-off adjacent LED to a switched-on LED acting as a sensor element. In particular, the individual LEDs are operated with pulse width modulation (PWM).

Advantageously, such a structure can avoid interference of the transistors of the driver IC by optical feedback. At the same time, such an arrangement can be implemented cost-effectively with comparatively few structural measures.

In one embodiment according to the first aspect, an adjacent LED of the same color in the second operating state is assigned as a sensor element to the respective LED in the first operating state. In an advantageous manner, a particularly efficient optical feedback and thus a precise control of the operating current of the LEDs can be achieved by LEDs of the same color.

In one embodiment according to the first aspect, the arrangement comprises a first switch, a second switch, and a buffer capacitor.

The first switch is controllably arranged to couple the respective sensor element to the input electrode of the regulating unit in the first operating state of the respective LED. The first switch is further controllably arranged to decouple the respective sensor element from the input electrode of the regulating unit in the second operating state of the respective LED.

The second switch is controllably arranged to couple the output transistor to the output electrode of the regulating unit in the first operating state of the respective LED. The second switch is further controllably arranged to decouple the output transistor from the output electrode of the regulating unit in the second operating state of the respective LED.

The buffer capacitor is coupled to the source electrode of the output transistor via an electrode and to the control electrode of the output transistor via a further electrode. The buffer capacitor is further arranged to hold the voltage present between the source electrode and the control electrode in the first operating state of the respective LED during the second operating state of the respective LED.

In an advantageous manner, the sensor element can thus switch itself to a light-emitting first operating state. The buffer capacitor can ensure that a calibration determined for the LED by the optical feedback, which is present in the form of a voltage at the output electrode of the operational amplifier or the control electrode of the output transistor, can also be used after decoupling by the switches.

In one embodiment according to the first aspect, a respective LED is associated with a respective photodiode as a sensor element.

In particular, this involves one dedicated photodiode per LED arranged in an optical path of the LED.

In one embodiment according to the first aspect, the arrangement comprises a mirror layer. The mirror layer extends along a side of the diode array that faces away from a light-emitting side of the diode array during intended operation.

The respective sensor element is arranged on a side of the mirror layer facing away from the diode array.

The mirror layer has an opening in each case. The opening is assigned to the respective LED and the corresponding sensor element, for example within the pixel cell inside the IC. The opening extends completely through the mirror layer from a side of the mirror layer facing the diode array to a side of the mirror layer facing the respective sensor element.

The mirror layer can also be referred to as a backside mirror. A slit, for example, can be considered as an opening.

Advantageously, this enables a compact component that has an optical path between the LED and the sensing element that allows the aforementioned optical feedback and control.

In one embodiment according to the first aspect, the arrangement comprises one or more metal layers.

The one or more metal layers is or are disposed on a side of the mirror layer facing away from the diode array.

The control unit is located on a side of the one or more metal layers facing away from the diode array.

Advantageously, an active part of the driver IC can thus be protected from interference. In particular, the metal layers are designed in such a way that the optical path between the opening and the sensor element is not blocked. For example, the metal layers also have openings or recesses for this purpose.

In one embodiment according to the first aspect, the LEDs are configured to emit blue light. In an advantageous way, a sensitivity of silicon to blue light is relatively low, so that transistors or the like of the driver IC remain largely undisturbed by the optical feedback.

According to a second aspect, the invention relates to a method of operating a diode array having an arrangement according to the first aspect.

The LEDs are sequentially light-emitting such that each LED is alternately in a light-emitting first operating state and a non-light-emitting second operating state.

A predetermined current for operating the respective LED in the first operating state is provided via the respective supply input.

A characteristic value that is representative of the luminous flux of the respective LED in the first operating state is detected by the sensor element and fed to the control unit.

An operating current actually supplied to the respective LED is adjusted by the control unit as a function of the characteristic value in such a way that the luminous flux of the respective LED approaches a specified reference luminous flux.

In one embodiment according to the second aspect, the same reference luminous flux is assigned to each LED. In particular, a reference current provided by the respective reference current source can be selected to be the same for each LED. Advantageously, this contributes to a homogeneous luminous image of the diode array.

Examples of embodiments of the invention are explained in more detail below with reference to the schematic drawings.

Figure 6:
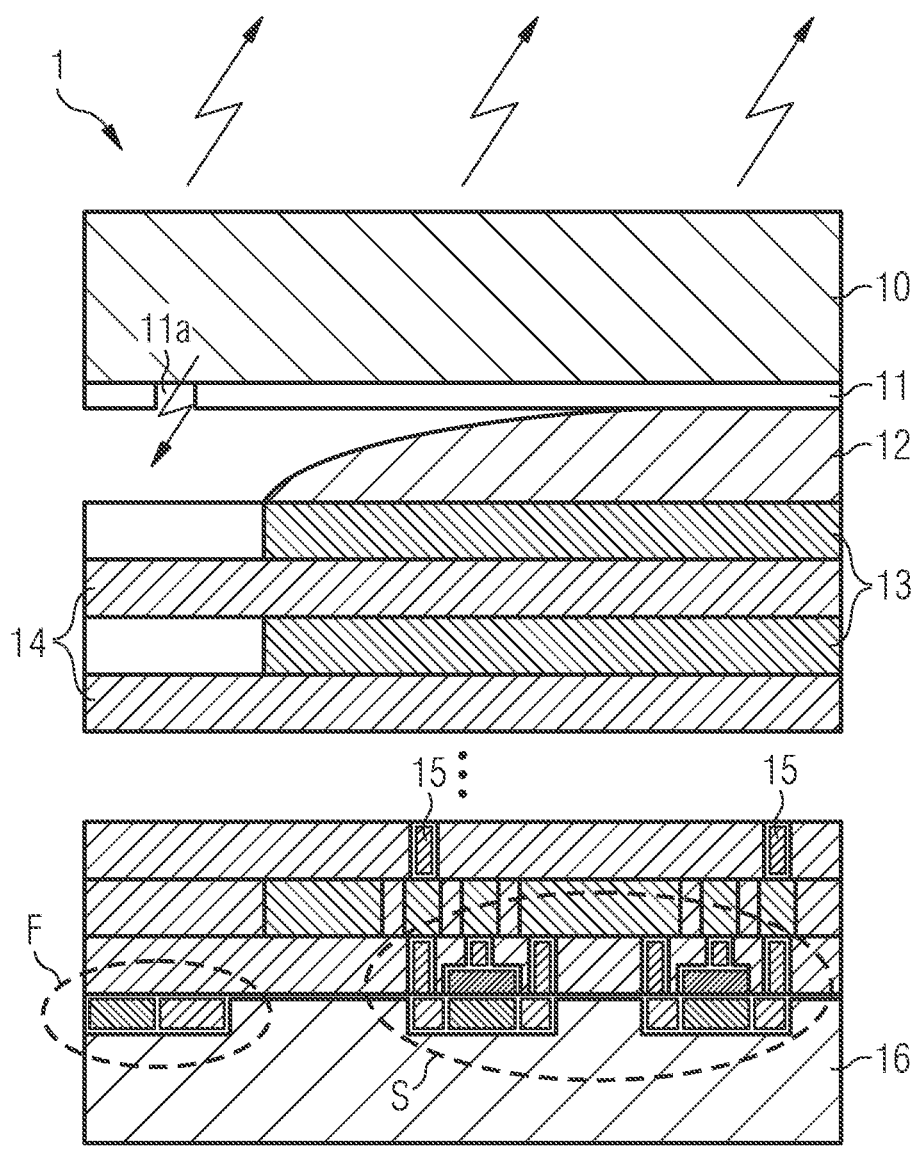
Figure 7:
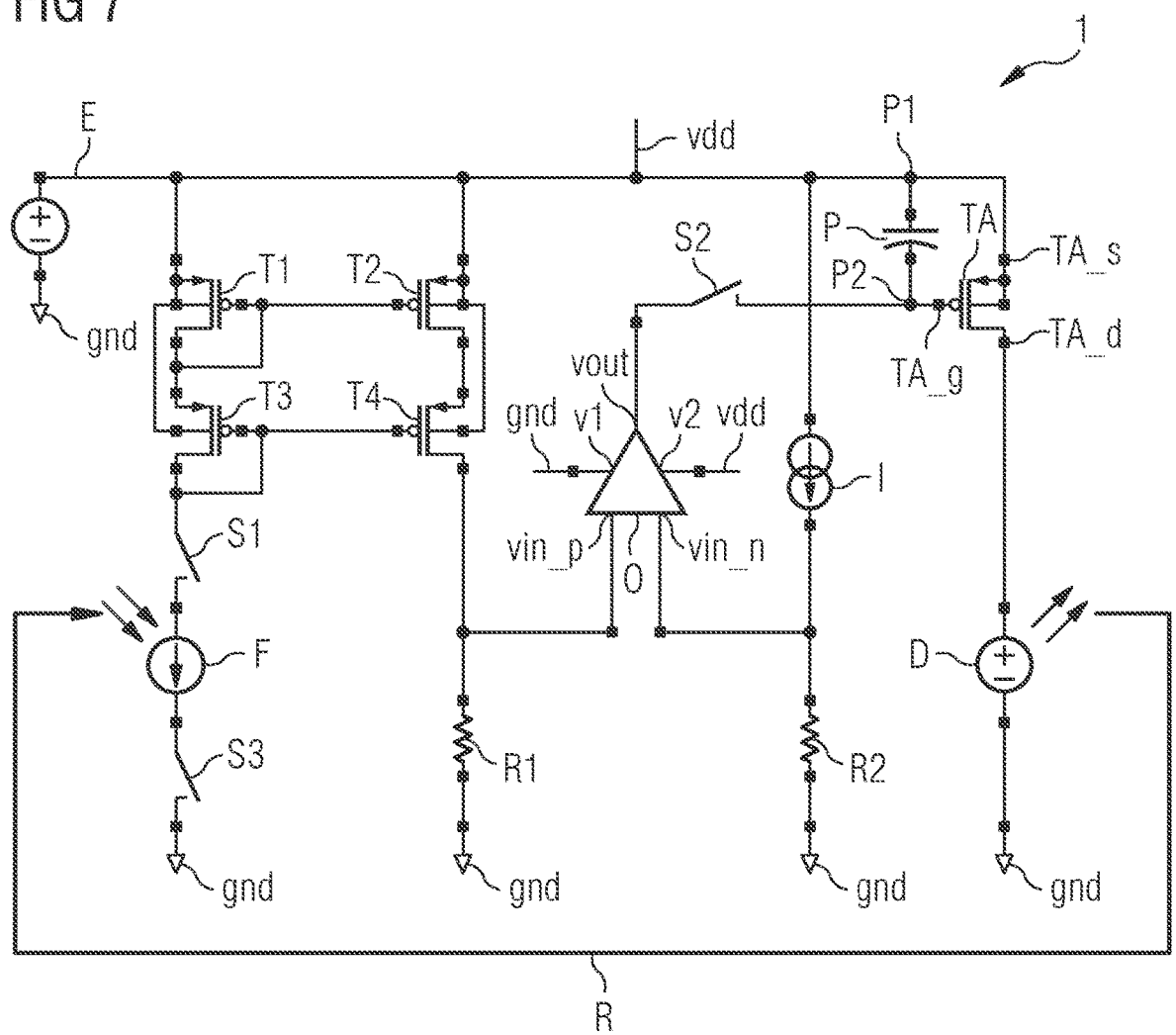

It show:

FIG. 1 an exemplary diode array;

FIGS. 2 to 5 first embodiment of a circuit for driving an LED of a diode array;

FIG. 6 a sectional view of the diode array with the circuit according to FIGS. 2 to 5;

FIG. 7 second embodiment of a circuit for driving an LED of a diode array.

Elements of the same design or function are provided with the same reference signs across all figures.

FIG. 1 shows a diode array 10 with a plurality of pixels 5*a*, 5*b* arranged in a matrix-like manner in n columns and m rows. The pixels 5*a*, 5*b* are each formed by one or more light emitting diodes (LEDs) D.

A supply of the individual pixels 5*a*, 5*b* or LEDs D is usually performed by current referencing. For this purpose, a reference current source 20 can be assigned to the diode array 10, which has an output line 8 for each pixel 5*a*, 5*b* of the diode array. Each LED D is thereby assigned a driver T which operates with the current reference. The LEDs D or the diode array 10 are controlled with the aid of the drivers T. Although their currents can be regulated with high precision, this regulation only affects the operating current of the LEDs D, but not any mismatch between the LEDs D, and does not take into account any local temperature differences between the individual LEDs D. The drivers T can be used to control the LEDs D or the diode array 10.

However, especially due to the temperature differences, an inhomogeneous luminous pattern of the diode array 10 may occur, which cannot be remedied even by elaborate control and high-precision design of the drivers T.

With reference to FIGS. 2 to 5, a first embodiment of an arrangement 1 for operating a diode array 10 is described, by which a homogeneous luminous image of the diode array 10 can be contributed to. For the sake of clarity, only a circuit for a single LED D of the diode array 10 is shown here as a section of the arrangement 1.

As shown, each LED D is assigned a sensor element F which is configured to detect a characteristic value representative of a luminous flux of the respective LED D. The sensor element F is a photodiode which is optically (back) coupled to the respective LED D via path R. According to the first embodiment, the sensor element F is a photodiode that is optically coupled (back) to the respective LED D via the path R. In this case, the characteristic value corresponds to a photocurrent caused by the luminous flux. In this case, the characteristic value corresponds to a photocurrent caused by the luminous flux.

In addition, each LED D is assigned a respective supply input E and a respective control unit S. The respective control unit S is connected on the input side to the respective supply input E and the respective sensor element F. On the output side, the respective control unit S is connected to the respective LED D and controls the operating current of the respective LED D as a function of the photocurrent.

Figure 3:
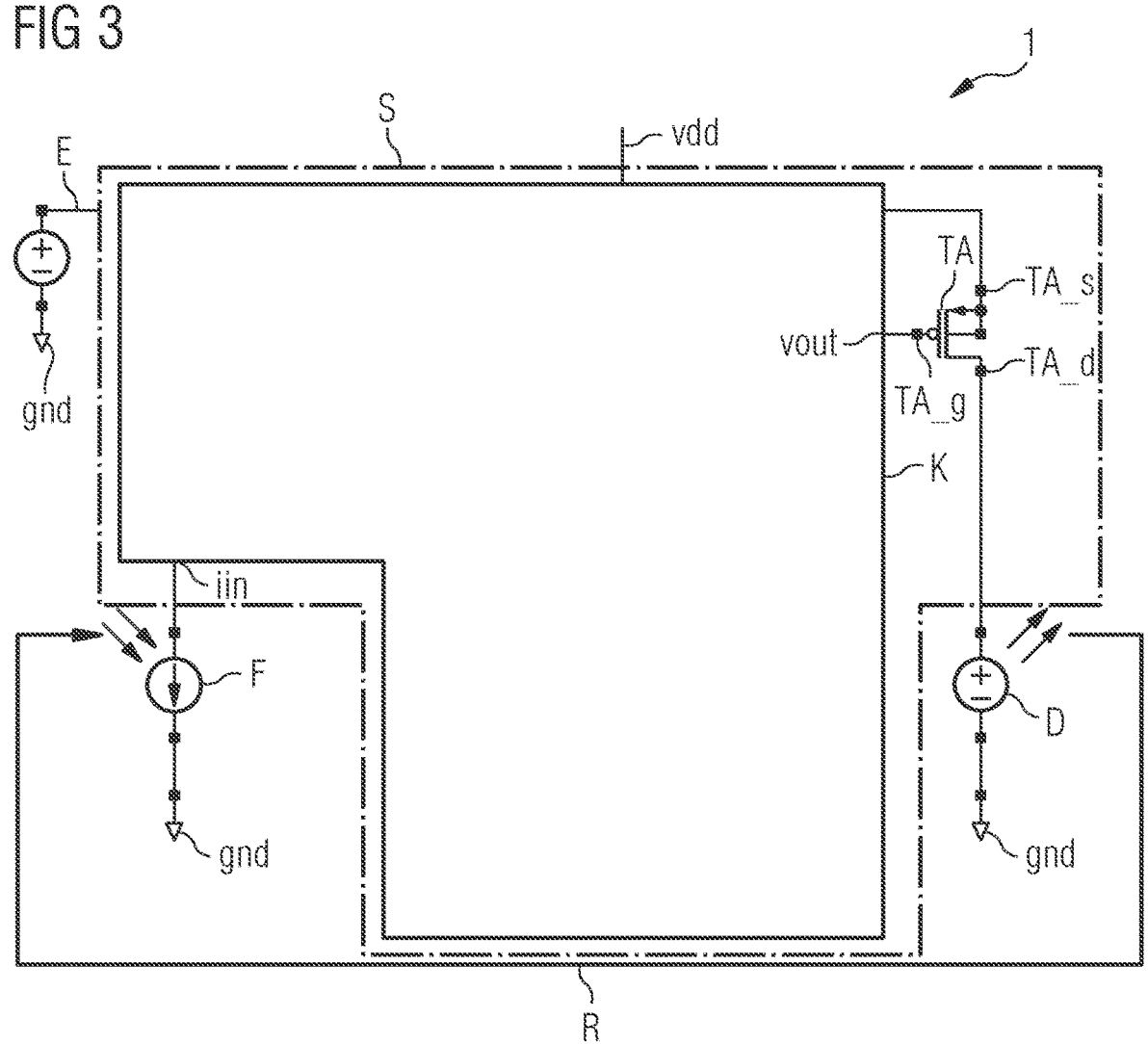
Figure 4:
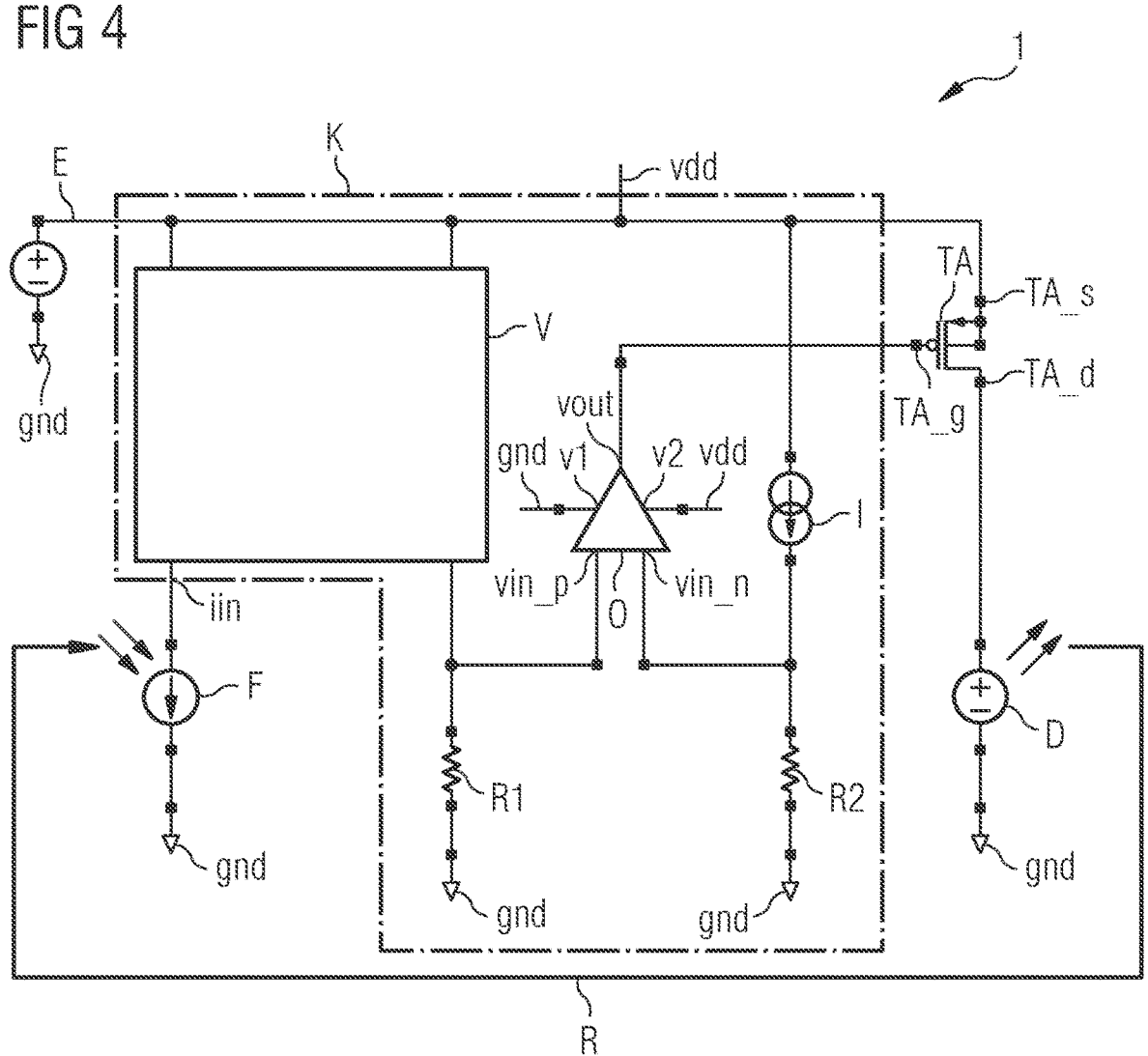
Figure 5:
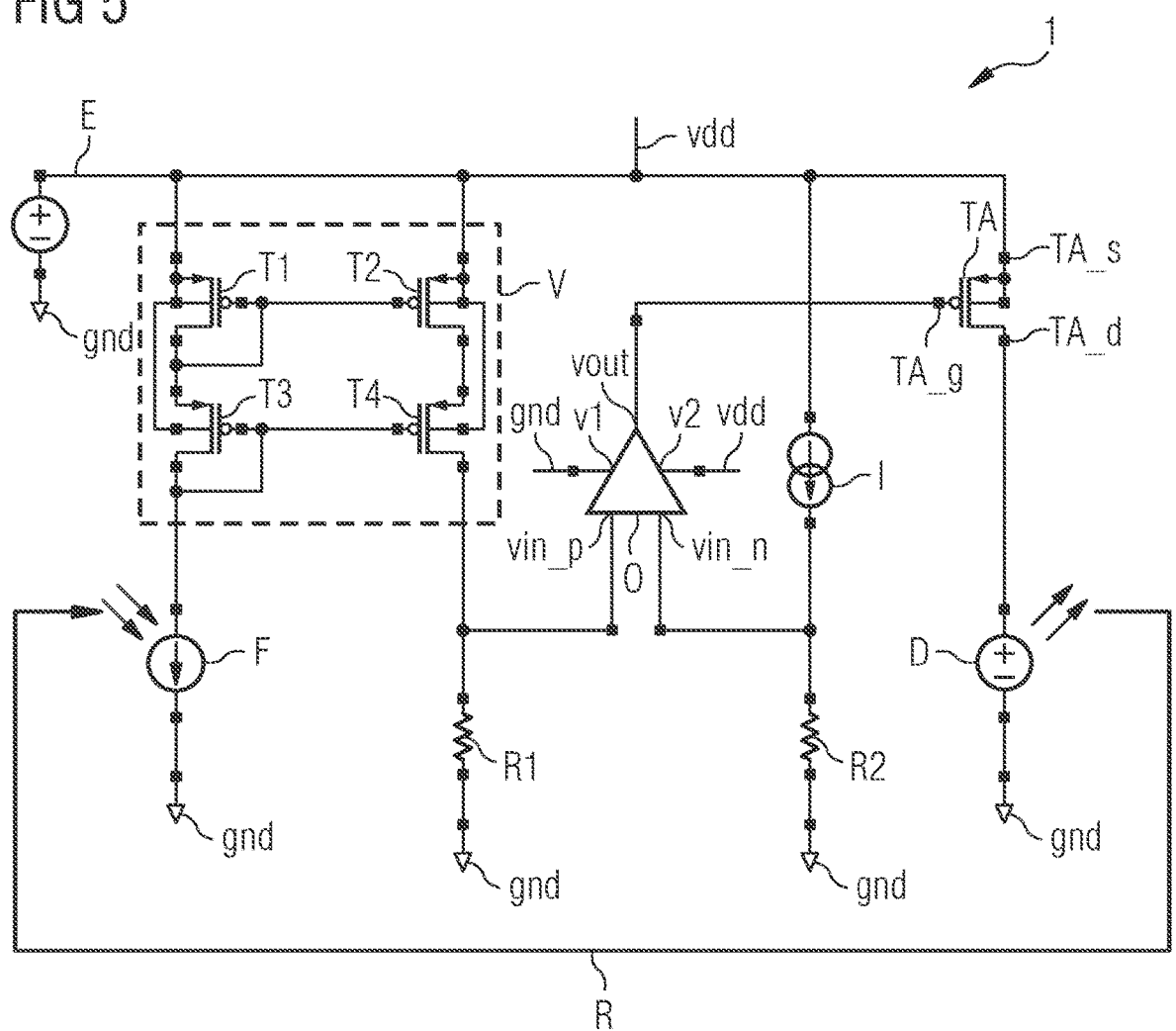

The respective control unit S detects the photocurrent and adjusts the operating current of the respective LED D accordingly. As shown in FIG. 3, a regulating unit K is assigned to the respective LED D for this purpose, which receives the photocurrent at the control input iin. Furthermore, an output transistor TA is connected upstream of the respective LED D, which can be controlled via its control electrode TA_g and the control output vout to provide the operating current for the respective LED D via its drain electrode TA_d.

The photocurrent of the sensor element F can first be amplified via a current mirror circuit V (cf. circuit diagram in FIG. 5 with PMOS transistors T1, T2, T3, T4) or similar and converted by a first resistor R1 into a voltage which is applied to a first control input vin_p of an operational amplifier O. The operational amplifier O compares this voltage with a reference voltage supplied to a second control input vin_n of the operational amplifier O. The reference voltage is then applied to the second control input vin_n. The operational amplifier O compares this voltage with a reference voltage supplied to a second control input vin_n of the operational amplifier O. The reference voltage drops across a second resistor R1. The reference voltage drops across a second resistor R2 at a reference branch to which a reference current of a reference current source I is applied. The operational amplifier O controls the output transistor TA in such a way that both voltages are equal. The reference current is selected so that an expected operating current flows through the LED D according to the current mirror ratio and the ratio of the operating current of the LED D to the photocurrent. Via the optical feedback R of a luminous intensity of the LED D to the induced photocurrent, a negative feedback is created. With a more efficient LED, the same operating current would result in a higher photocurrent, so the arrangement would reduce the operating current through LED D again. The mismatch between neighboring LEDs D is thus irrelevant, but only the matching of the sensor elements F, which is usually much better. Furthermore, this principle counteracts the change in brightness of two LEDs D at different temperatures, which can be seen with constantly regulated current sources.

Changing the coupling factor of the operating current of LED D to the photocurrent results in a linear change of the operating current in the simulation. In the simulation, a higher coupling factor corresponds to a more efficient LED, which shines brighter with the same current, since the photodiode generates more current with the same operating current of LED D. The operating current must therefore be reduced, which the circuit does as expected. The operating current must therefore be reduced, which the circuit does as expected. The luminosity of LED D thus remains constant, regardless of its efficiency or temperature.

With reference to FIG. 6, a sectional view of a part of the diode array 10 with the arrangement 1 for an LED D explained in FIGS. 2 to 5 is shown.

The diode array 10 is here soldered onto the silicon driver IC (shown here schematically by the control unit S on substrate 16 with vias 15) and forms a chip. On the back of the LED there is, among other things, a mirror layer 11 in the form of a metallization which ensures that the emitted light of the LEDs D is reflected and emerges at the surface of the respective LED D (so-called backside mirror). Furthermore, the chip has a solder layer 12, one or more IC metal layers 13 and an IMD layer (inter-metal dielectric) arranged in between. An opening 11a in the mirror layer 11, for example formed as a small slit, allows part of the light to penetrate the silicon chip. There, the light strikes a photodiode as sensor element F. In this context, further layers blocking the optical path between the respective LED D and the respective sensor element F can be slotted or recessed in this area as indicated schematically by the solder layer 12 and the metal layers 13. The sensor element F can thus measure the optical output of the respective LED D so that the operating current of the LED D can be controlled accordingly. The remaining active part of the IC is covered with metal layers 13 above it, as shown, so that it is not affected.

The advantage of this method is that the LEDs D are thus controlled to the same light output, rather than to the most precise drive current. In this way, the mismatch of the LEDs D can be counteracted, and the luminous image of the diode array 10 can be realized much more homogeneously.

With reference to FIG. 7, a second embodiment of an arrangement 1 for operating a diode array 10 is described, by which a homogeneous luminous image of the diode array 10 can be contributed to. For the sake of clarity, only a circuit for a single LED D of the diode array 10 is shown here as a section of the arrangement 1.

Instead of providing a dedicated photodiode as in the first embodiment, an adjacent LED of the diode array 10 with respect to the LED D to be operated is used as the sensing element F here. In other words, optical coupling between adjacent LEDs is exploited to measure the optical output of the LED D.

For this purpose, it is first necessary to select a "measuring" LED, which is not currently illuminated itself, as sensor element F and to integrate it into a measuring path of the circuit in "reverse" operation. For this purpose, a first switch S1, S3, which, depending on the operating state of the "measuring" LED, switches it in the blocking direction into the measuring path of the neighboring LED D (switch S1, S3 closed) or permits light-emitting operation of the "measuring" LED in the flow direction (switch S1, S3 open). The wiring of the "measuring" LED for light-emitting operation then corresponds to the variant shown for LED D; the combined representation was omitted for reasons of clarity.

In addition, a second switch S2 can also be used to decouple the operational amplifier O from the control electrode TA_g.

Due to the PWM operation of the LEDs D, which is common for diode arrays 10, the above-mentioned switching operations are possible without any problems within a complete operating phase of the diode array 10 (so-called "frame"). For the remaining operating phase, i.e. for the remaining frame (in which the control cannot run), the gate-source voltage of the output transistor TA is stored to a capacitance. For this purpose, the gate electrode TA_g and the source electrode TA_s of the output transistor TA are each connected to one of the two electrodes P1, P2 of a buffer capacitor P.

Thus, instead of the dedicated photodiode, only switches S1-S3 and buffer capacitor P are required to achieve equivalent control.

The above embodiments are particularly suitable for the application of LEDs, so-called stacked chips, and µLEDs.

In summary, the shift of the driver feedback from the electrical to the optical domain and regulation of the current of the driver depending on the actually emitted light power of the LED to be driven can be done as described on the basis of the first embodiment example via a small backside slit which lets a part of the light onto a silicon diode. Alternatively, as described with reference to the first embodiment, a measurement with a currently inactive neighboring LED is also possible using parasitic optical coupling.

Advantageously, with the proposed arrangements, a homogeneous luminous image of the diode array 10 can be achieved without the need for complex, pixel-fine and/or temperature-dependent calibration.

Calibration data is usually first generated pixel by pixel in an optical product test. For large diode arrays, this represents a lengthy additional effort with high costs for the end product.

Moreover, measurement of the local temperature with respect to the individual LEDs D during operation of the diode array 10 in order to perform real time (on-the-fly) PWM calibration can be omitted.

The invention is not limited to the embodiments by the description based on the embodiments. Rather, the invention encompasses any new feature as well as any combination of features, which in particular includes any combination of features in the patent claims, even if this feature or combination itself is not explicitly stated in the patent claims or embodiments.

| List of reference signs | | | |
| --- | --- | --- | --- |
| m | Row | R | Feedback |
| n | Column | V | Current mirror circuit |
| 5a, 5b | Image element | R1, R2 | Resistor |
| 8 | Output line | I | Reference current source |
| 20 | Current Reference | O | Operational amplifier |
| T | Driver | vin_p | Control input |

-continued

| List of reference signs | | | |
|---|---|---|---|
| D | LED | vin_n | Control input |
| vdd | Supply voltage | v1, v2 | Supply input |
| gnd | Ground | T1-T4 | Transistor |
| TA | Output transistor | P | Buffer capacitor |
| TA_s | Source electrode | P1, P2 | Capacitor electrode |
| TA_d | Drain electrode | S1-S3 | Switch |
| TA_g | Control electrode | 10 | Diode array |
| K | Regulating unit | 11 | Mirror layer |
| vout | Output electrode | 12 | Solder layer |
| iin | Input electrode | 13 | Metal layer |
| E | Supply input | 14 | IMD layer |
| S | Control unit | 15 | Via |
| F | Sensor element | 16 | Substrate |

The invention claimed is:

1. An arrangement for operating a diode array, comprising a plurality of light-emitting diodes (LEDs), each LED being assigned a respective sensor element which is configured to detect a characteristic value representative of a luminous flux of the respective LED,
a respective supply input for providing a current for light-emitting operation of the respective LED, and
in each case a control unit which is coupled on the input side to the respective supply input and the respective sensor element and on the output side to the respective LED and is configured to control the current for light-emitting operation of the respective LED as a function of the corresponding characteristic value,
wherein
the respective sensor element is configured to provide an output current depending on the corresponding characteristic value,
the respective control unit comprises an output transistor with a drain electrode, a control electrode and a source electrode, and a regulating unit with an input electrode and an output electrode, wherein
the output transistor is coupled to the respective supply input via the source electrode, is coupled to the output electrode of the regulating unit via the control electrode, and is coupled to the respective LED via the drain electrode,
the regulating unit for receiving the output current is coupled to the respective sensor element via the input electrode and is coupled to the control electrode of the output transistor via the output electrode, wherein the regulating unit is configured to compare the output current with a reference current and to switch the output transistor as a function of the comparison,
the regulating unit comprises a current mirror circuit, a first resistor, a second resistor, a reference current source and an operational amplifier having a first control input, a second control input and the output electrode,
the current mirror circuit is coupled on the input side to the respective sensor element, is configured to amplify the output current and is coupled on the output side to the first resistor and to the first control input, and
the reference current source is coupled on the output side to the second resistor and to the second control input.

2. The arrangement according to claim 1, wherein the arrangement is configured to sequentially light-emittingly operate the LEDs in the intended operation of the diode array, such that each LED is alternately in a light-emitting first operating state and a non-light-emitting second operating state; and a respective LED in the first operating state is in each case assigned an adjacent LED in the second operating state as sensor element.

3. The arrangement according to claim 2, wherein the respective LED in the first operating state is in each case assigned an adjacent LED of the same color in the second operating state as a sensor element.

4. The arrangement according to claim 2, comprising a first switch, a second switch, and a buffer capacitor, wherein
the first switch is controllably configured to couple the respective sensor element to the input electrode of the regulating unit in the first operating state of the respective LED and to decouple it from the input electrode of the regulating unit in the second operating state of the respective LED,
the second switch is controllably configured to couple the output transistor to the output electrode of the regulating unit in the first operating state of the respective LED and to decouple it from the output electrode of the regulating unit in the second operating state of the respective LED, and
the buffer capacitor is coupled via an electrode to the source electrode of the output transistor and via a further electrode to the control electrode of the output transistor and is configured to hold the voltage present between the source electrode and the control electrode in the first operating state of the respective LED during the second operating state of the respective LED.

5. The arrangement according to claim 1, wherein a photodiode is assigned to each LED as a sensor element.

6. The arrangement according to claim 5, further comprising a mirror layer extending along a side of the diode array facing away from a light emitting side of the diode array in intended operation, wherein
the respective sensor element is arranged on a side of the mirror layer facing away from the diode array,
the mirror layer has in each case an opening which is assigned to the respective LED and the corresponding sensor element and extends completely through the mirror layer from a side of the mirror layer facing the diode array to a side of the mirror layer facing the respective sensor element.

7. The arrangement according to claim 6, further comprising one or more metal layers, wherein
the one or more metal layers are arranged on a side of the mirror layer facing away from the diode array, and
the respective control unit is arranged on a side of the one or more metal layers facing away from the diode array.

8. The arrangement according to claim 5, wherein the LEDs are configured to emit blue light.

9. A method of operating a diode array comprising the arrangement according to claim 1, the method comprising:
controlling the LEDs such that each LED is alternately in a light-emitting first operating state and a non-light-emitting second operating state,
providing, by way of the supply input, a predetermined current for operating the respective LED in the first operating state,
detecting, by the respective sensor element, a characteristic value which is representative of the luminous flux of the respective LED in the first operating state,
feeding the detected characteristic value to the respective control unit, and
adapting, by the respective control unit as a function of the fed back characteristic value, an operating current actually supplied to the respective LED in such a way that the luminous flux of the respective LED approaches a predetermined reference luminous flux.

10. The method according to claim 9, wherein the same reference luminous flux is assigned to each LED.

11. An arrangement for operating a diode array, comprising
a first switch,
a second switch,
a buffer capacitor,
a plurality of light-emitting diodes (LEDs), each LED being assigned a respective sensor element which is configured to detect a characteristic value representative of a luminous flux of the respective LED,
a respective supply input for providing a current for light-emitting operation of the respective LED, and
in each case a control unit which is coupled on the input side to the respective supply input and the respective sensor element and on the output side to the respective LED and is configured to control the current for light-emitting operation of the respective LED as a function of the corresponding characteristic value,
wherein
the respective sensor element is configured to provide an output current depending on the corresponding characteristic value,
the respective control unit comprises an output transistor with a drain electrode, a control electrode and a source electrode, and a regulating unit with an input electrode and an output electrode,
the output transistor is coupled to the respective supply input via the source electrode, is coupled to the output electrode of the regulating unit via the control electrode, and is coupled to the respective LED via the drain electrode,
the regulating unit for receiving the output current is coupled to the respective sensor element via the input electrode and is coupled to the control electrode of the output transistor via the output electrode, wherein the regulating unit is configured to compare the output current with a reference current and to switch the output transistor as a function of the comparison,
the arrangement is configured to sequentially light-emittingly operate the LEDs in the intended operation of the diode array, such that each LED is alternately in a light-emitting first operating state and a non-light-emitting second operating state,
a respective LED in the first operating state is in each case assigned an adjacent LED in the second operating state as sensor element,
the first switch is controllably configured to couple the respective sensor element to the input electrode of the regulating unit in the first operating state of the respective LED and to decouple it from the input electrode of the regulating unit in the second operating state of the respective LED,
the second switch is controllably configured to couple the output transistor to the output electrode of the regulating unit in the first operating state of the respective LED and to decouple it from the output electrode of the regulating unit in the second operating state of the respective LED, and
the buffer capacitor is coupled via an electrode to the source electrode of the output transistor and via a further electrode to the control electrode of the output transistor and is configured to hold the voltage present between the source electrode and the control electrode in the first operating state of the respective LED during the second operating state of the respective LED.

12. An arrangement for operating a diode array, comprising
a mirror layer extending along a side of the diode array facing away from a light emitting side of the diode array in intended operation,
a plurality of light-emitting diodes (LEDs), each LED being assigned a respective sensor element which is configured to detect a characteristic value representative of a luminous flux of the respective LED,
a respective supply input for providing a current for light-emitting operation of the respective LED, and
in each case a control unit which is coupled on the input side to the respective supply input and the respective sensor element and on the output side to the respective LED and is configured to control the current for light-emitting operation of the respective LED as a function of the corresponding characteristic value,
wherein
the respective sensor element is configured to provide an output current depending on the corresponding characteristic value,
the respective control unit comprises an output transistor with a drain electrode, a control electrode and a source electrode, and a regulating unit with an input electrode and an output electrode,
the output transistor is coupled to the respective supply input via the source electrode, is coupled to the output electrode of the regulating unit via the control electrode, and is coupled to the respective LED via the drain electrode,
the regulating unit for receiving the output current is coupled to the respective sensor element via the input electrode and is coupled to the control electrode of the output transistor via the output electrode, wherein the regulating unit is configured to compare the output current with a reference current and to switch the output transistor as a function of the comparison,
a photodiode is assigned to each LED as a sensor element,
the respective sensor element is arranged on a side of the mirror layer facing away from the diode array, and
the mirror layer has in each case an opening which is assigned to the respective LED and the corresponding sensor element and extends completely through the mirror layer from a side of the mirror layer facing the diode array to a side of the mirror layer facing the respective sensor element.

\* \* \* \* \*